(12) United States Patent
Cao

(10) Patent No.: US 10,063,136 B2
(45) Date of Patent: Aug. 28, 2018

(54) CONTROL CIRCUITS OF SWITCHING POWER SUPPLY

(71) Applicant: Shenzhen China Star Optoelectronics Technology Co., Ltd., Shenzhen, Guangdong (CN)

(72) Inventor: Dan Cao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 175 days.

(21) Appl. No.: 15/300,428

(22) PCT Filed: Aug. 11, 2016

(86) PCT No.: PCT/CN2016/094683
§ 371 (c)(1),
(2) Date: Sep. 29, 2016

(87) PCT Pub. No.: WO2018/014386
PCT Pub. Date: Jan. 25, 2018

(65) Prior Publication Data
US 2018/0183324 A1    Jun. 28, 2018

(30) Foreign Application Priority Data

Jul. 19, 2016 (CN) .......................... 2015 1 0575651

(51) Int. Cl.
*H02M 1/36* (2007.01)
*H02M 1/00* (2006.01)

(52) U.S. Cl.
CPC ...... *H02M 1/36* (2013.01); *H02M 2001/0006* (2013.01); *H02M 2001/0032* (2013.01)

(58) Field of Classification Search
CPC ................................. H02M 1/36; H03K 1/58
See application file for complete search history.

(56) References Cited

U.S. PATENT DOCUMENTS

| | | | |
|---|---|---|---|
| 6,507,231 B1 * | 1/2003 | Hecht | H03K 5/08 327/321 |
| 8,890,599 B1 * | 11/2014 | Xiao | H03K 5/08 327/312 |
| 9,088,274 B1 * | 7/2015 | Chaudhry | H03K 5/08 |

* cited by examiner

*Primary Examiner* — Hai L Nguyen
(74) *Attorney, Agent, or Firm* — Andrew C. Cheng

(57) ABSTRACT

The present disclosure relates to a control circuit of the switching power supply including a soft-booting voltage generation circuit, a first comparator, a voltage selection circuit, a switching circuit, a second comparator, an error amplification circuit, and a pulse signal control circuit. During the soft-booting phase and during the operational phase, different superposition voltages are superposed with the control voltage by the voltage selection circuit to obtain the clamping voltage. Thus, different clamping voltages are configured during the soft-booting phase and the operational phase, which contributes to the system stability. In addition, when the output voltage of the switching circuit is greater than the reference voltage, the second comparator outputs the first high level signals to the clock signal generator. The clock signal generator then stops operations, that is, and the control circuit of the switching power supply is in the sleep mode, which enhances the efficiency of the power.

9 Claims, 1 Drawing Sheet

CONTROL CIRCUITS OF SWITCHING POWER SUPPLY

BACKGROUND OF THE INVENTION

1. Field of the Invention

The present disclosure relates to power supply control technology, and more particularly to a control circuit of switching power supply.

2. Discussion of the Related Art

Switching power supply generally includes pulse width modulation (PWM) control IC and MOSFET. By controlling the ratio of the turn-on time period of the transistor to the turn-off time period of the transistor, the outputted voltage is kept stably. The switching power supply is characterized by attributes such as small, light, and high efficiency, and thus has been widely adopted in electronic devices. The switching power supply may waste electricity during a booting process, and may result in output overshoot. Thus, to prevent the IC or the system from damaged by the overshoot, usually, a control circuit of the switching power supply is configured. Conventionally, the clamping voltage during the soft-booting phase and the operational phase of the control circuit remain the same. As such, during the soft-booting phase, the system may not be stable due to the low clamping voltage. At the same time, during the operation phase, the system cannot enter the sleep mode when the clamping voltage is too high, and the efficiency of the switching power supply may be affected.

SUMMARY

To overcome the above-mentioned problem, the control circuit of switching power supply is proposed to enhance the stability and the efficiency of the power supply.

In one aspect, a control circuit of switching power supply includes: a soft-booting voltage generation circuit, a first comparator, a voltage selection circuit, a switching circuit, a second comparator, an error amplification circuit, and a pulse signal control circuit; the first comparator compares a voltage of an output end of the soft-booting voltage generation circuit with a threshold voltage, and outputs selection level signals to the voltage selection circuit; the error amplification circuit applies an error amplification toward the voltage of an output end of the switching power supply according to the voltage of the output end of the soft-booting voltage generation circuit, and outputs a control voltage to the voltage selection circuit; the voltage selection circuit selects a corresponding superposition voltage according to a level of the selection level signals, and the selected superposition voltage is superposed with the control voltage to obtain a clamping voltage for outputting to the switching circuit; the switching circuit compares the clamping voltage with a reference voltage, when the clamping voltage is greater than the reference voltage, the switching outputs the clamping voltage via the output end connecting to an auxiliary voltage source and the second comparator, wherein the voltage of the auxiliary voltage source is greater than the voltage of the reference voltage, the output end of the switching power supply respectively connects to the error amplification circuit and the pulse signal control circuit; the second comparator compares the voltage of the output end of the switching circuit with the voltage of the reference voltage, and the second comparator outputs first high level signals to the pulse signal control circuit upon determining the voltage of the output end of the switching circuit is greater than the voltage of the reference voltage; and the pulse signal control circuit outputs first low level signals to the pulse signal generator of the switching power supply according to the first high level signals.

Wherein the voltage selection circuit includes a code-dialing switch, a first voltage source, and a second voltage source; the code-dialing switch respectively connects to the first comparator, the switching circuit, a positive pole of the first voltage source, and a positive pole of the second voltage source; and negative poles of the first voltage source and the second voltage source respectively connect to the error amplification circuit and the output end of the switching circuit, and the code-dialing switch selects one of the first voltage source and the second voltage source to be a superposition voltage according to the level of the selection level signals.

Wherein the voltage selection circuit further includes a RC circuit, and the negative poles of the first voltage source and the second voltage are respectively grounded via the RC circuit.

Wherein the switching circuit includes a third comparator and a transistor, an non-inverting input of the third comparator connects to the code-dialing switch, an inverting input of the third comparator receives the reference voltage, an output end of the third comparator connects to a gate of the transistor, a drain of the transistor connects to the auxiliary voltage source, and a source of the transistor operates as the output end of the switching circuit.

Wherein the pulse signal control circuit includes a fourth comparator, an adder, a wave generator, and a clock signal generator, an non-inverting input of the fourth comparator connects to the adder, an inverting input of the fourth comparator connects to the output end of the switching circuit, an output end of the fourth comparator connects to a first input end of the pulse signal generator, the wave generator connects between the adder and the clock signal generator, and the adder further connects to an input end of the switching power supply, and the clock signal generator respectively connects to the second comparator and a second output end of the pulse signal generator.

Wherein the soft-booting voltage generation circuit includes a voltage source, a current generator, and a capacitor, the current generator connects to the voltage source, the current generator is grounded via the capacitor, and the output end of the soft-booting voltage generation circuit connects between the current generator and the capacitor.

Wherein an non-inverting input of the first comparator receives the threshold voltage, an inverting input of the first comparator connects to the output end of the soft-booting voltage generation circuit, and the output end of the first comparator connects to the code-dialing switch; and an non-verting input of the second comparator connects to the output end of the switching circuit, an inverting input of the second comparator receives the reference voltage, and an output end of the second comparator connects to the clock signal generator.

Wherein the first comparator compares the voltage of the output end of the soft-booting voltage generation circuit with the threshold voltage, and outputs the second high level signals to the code-dialing switch upon determining the voltage of the output end of the soft-booting voltage generation circuit is smaller than the threshold voltage, and the code-dialing switch connects the first voltage source with the non-inverting input of the third comparator upon receiving the second high level signals.

Wherein the first comparator compares the voltage of the output end of the soft-booting voltage generation circuit with the threshold voltage, and outputs the second low level signals to the code-dialing switch upon determining the voltage of the output end of the soft-booting voltage generation circuit is greater than the threshold voltage, and the code-dialing switch connects the second voltage source with the non-inverting input of the third comparator upon receiving the second low level signals.

In view of the above, during the soft-booting phase, the code-dialing switch connects the first voltage source to the third comparator. During the operational phase, the code-dialing switch connects the second voltage source to the third comparator. As such, different clamping voltages are configured during the soft-booting phase and the operational phase, which contributes to the system stability. In addition, when the output voltage of the error amplification circuit is greater than the voltage threshold voltage of the clamping voltage, the second comparator outputs the first high level signals ($V_{sleep}$) to the clock signal generator. The clock signal generator stops operations, that is, the control circuit of the switching power supply is in the sleep mode, which enhances the efficiency of the power.

DETAILED DESCRIPTION OF THE EMBODIMENTS

Figure 1:
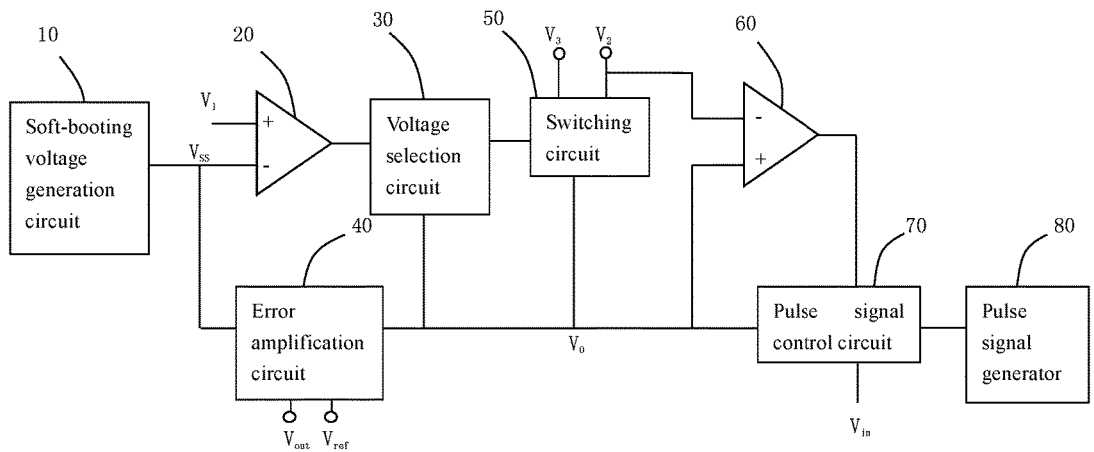
FIG. 1 is a schematic view of the control circuit of the switching power supply in accordance with one embodiment.

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

Referring to FIG. 1, the control circuit of the switching power supply includes a soft-booting voltage generation circuit 10, a first comparator 20, a voltage selection circuit 30, an error amplification circuit 40, a switching circuit 50, a second comparator 60, and a pulse signal control circuit 70, wherein a control mode of the control circuit of the switching power supply is a peak current control mode.

An non-inverting input of the first comparator 20 connects to a threshold voltage source ($V_1$), an inverting input of the first comparator 20 connects to an output end ($V_{SS}$) of the soft-booting voltage generation circuit 10, and an output end of the first comparator 20 connects to the voltage selection circuit 30. The error amplification circuit 40 respectively connects to the output end ($V_{SS}$) of the soft-booting voltage generation circuit 10, the voltage selection circuit 30, and an output end ($V_o$) of the switching circuit 50. The switching circuit 50 also respectively connects to the voltage selection circuit 30 and a reference voltage source ($V_2$). An non-verting input of the second comparator 60 connects to the output end ($V_o$) of the switching circuit 50, the inverting input of the second comparator 60 connects to the reference voltage source ($V_2$), and the output end of the second comparator 60 connects to the pulse signal control circuit 70. The pulse signal control circuit 70 also connects to the output end ($V_o$) of the switching circuit 50 and a pulse signal generator 80 of the switching power supply. In addition, the error amplification circuit 40 respectively connects to the output end ($V_{out}$) of the switching power supply and a reference voltage source ($V_{ref}$), and the switching circuit 50 further connects to an auxiliary voltage source ($V_3$).

The first comparator 20 compares a voltage of the output end ($V_{SS}$) of the soft-booting voltage generation circuit 10 with a threshold voltage, and outputs selection level signals to the voltage selection circuit 30. The error amplification circuit 40 applies an error amplification toward the voltage of the output end ($V_{out}$) of the switching power supply according to the voltage of the output end ($V_{SS}$) of the soft-booting voltage generation circuit 10, and outputs a control voltage to the voltage selection circuit 30. The voltage selection circuit 30 selects a corresponding superposition voltage according to a level of the selection level signals, and the selected superposition voltage is superposed with the control voltage to obtain a clamping voltage for outputting to the switching circuit 50. The switching circuit 50 compares the clamping voltage with the reference voltage. When the clamping voltage is greater than the reference voltage, the switching circuit 50 outputs the clamping voltage via the output end ($V_o$) connecting to the auxiliary voltage source ($V_3$) and the second comparator 60, wherein the voltage of the auxiliary voltage source ($V_3$) is greater than the voltage of the reference voltage source ($V_2$). The second comparator 60 compares the voltage of the output end ($V_o$) of the switching circuit 50 with the voltage of the reference voltage source ($V_2$), and the second comparator 60 outputs first high level signals ($V_{sleep}$) to the pulse signal control circuit 70 upon determining the voltage of the output end ($V_o$) of the switching circuit is greater than the voltage of the reference voltage. The pulse signal control circuit 70 outputs first low level signals to the pulse signal generator 80 of the switching power supply according to the first high level signals.

Figure 2:
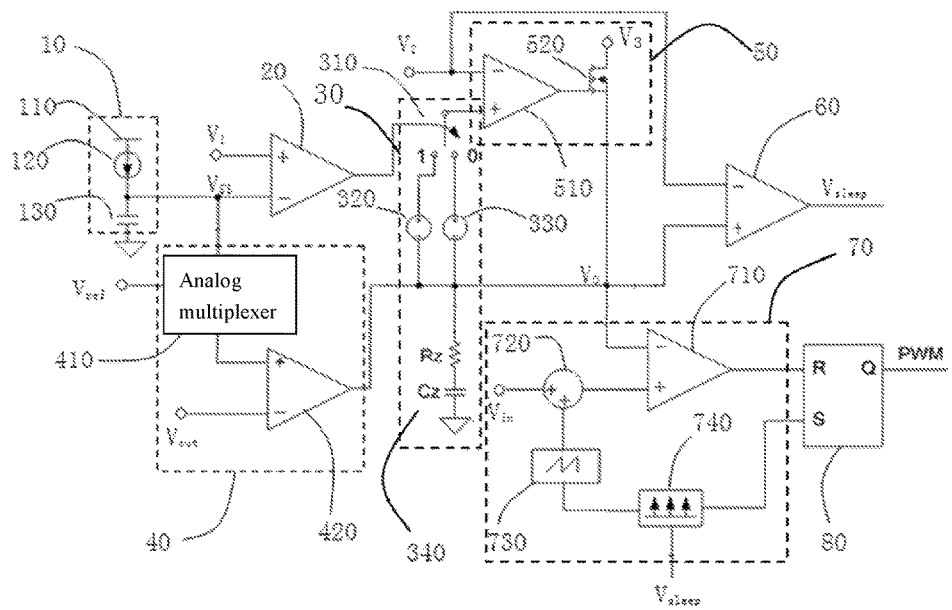
FIG. 2 is a circuit diagram of the control circuit of the switching power supply in accordance with one embodiment.

Referring to FIG. 2, the voltage selection circuit 30 includes a code-dialing switch 310, a first voltage source 320, a second voltage source 330, and a RC circuit 340. The code-dialing switch 310 respectively connects to an output end of the first comparator 20, a positive pole of the first voltage source 320, a positive pole of the second voltage source 330, and the switching circuit 50. Negative poles of the first voltage source 320 and the second voltage source 330 respectively connect to the RC circuit 340 and the switching circuit 50. The negative poles of the first voltage source 320 and the second voltage source 330 are respectively grounded via the RC circuit 340. The code-dialing switch 310 selects one of the first voltage source 320 and the second voltage source 330 to be the superposition voltage according to the level of the selection level signals.

Specifically, the switching circuit 50 includes a third comparator 510 and a transistor 520. An non-inverting input of the third comparator 510 connects to the code-dialing switch 310, an inverting input of the third comparator 510 connects to the reference voltage source ($V_2$), an output end of the third comparator 510 connects to a gate of the transistor 520, a drain of the transistor 520 connects to the auxiliary voltage source ($V_3$), a source of the transistor 520 operates as the output end ($V_o$) of the switching circuit 50, wherein the transistor 520 is a NMOS.

Specifically, the pulse signal control circuit 70 includes a fourth comparator 710, an adder 720, a wave generator 730, and a clock signal generator 740. An non-inverting input of the fourth comparator 710 connects to the adder 720, an inverting input of the fourth comparator 710 connects to the output end ($V_o$) of the switching circuit 50, an output end of the fourth comparator 710 connects to a first input end of the pulse signal generator 80, the wave generator 730 connects between the adder 720 and the clock signal generator 740, and the adder 720 further connects to an input end ($V_{in}$) of the switching power supply, wherein the waveform outputted by the wave generator 730 is a triangular wave for performing a slope compensation toward the input end ($V_{in}$) of the switching power supply. The clock signal generator 740 respectively connects to the output end of the second comparator 60 and the second output end of the pulse signal generator 80. The pulse signal generator 80 may be triggers of various types capable of generating the pulse signals. In the embodiment, the pulse signal generator 80 is a Schmitt trigger. The clock signal generator 740 outputs clock signals to the wave generator 730. The wave generator 730 outputs the triangular waves to the adder 720 when being triggered by the clock signals. The adder 720 superposes the voltage of the input end ($V_{in}$) of the switching power supply with the triangular waves, and the superposition voltage is outputted to the non-inverting input of the fourth comparator 710. The fourth comparator 710 compares the voltage of the superposition voltage with the voltage of the output end ($V_o$) of the switching circuit 50, and outputs comparison level signals to a first input end of the pulse signal generator 80. The pulse signal generator 80 outputs the control level signals to the switching power supply in accordance with the comparison level signals and the clock signals.

The soft-booting voltage generation circuit 10 includes a voltage source 110, a current generator 120, and a capacitor 130. The current generator 120 connects to the voltage source 110, the current generator 120 is grounded via the capacitor 130, and the output end ($V_{SS}$) of the soft-booting voltage generation circuit 10 connects between the current generator 120 and the capacitor 130. The voltage of the output end ($V_{SS}$) of the soft-booting voltage generation circuit 10 gradually increases along with the charging and the discharging of the capacitor 130 so as to realize the soft-booting of the switching power supply. When the voltage of the output end ($V_{SS}$) of the soft-booting voltage generation circuit 10 is smaller than the voltage of the threshold voltage source ($V_1$), the control circuit of the switching power supply is in the soft-booting phase. When the voltage of the output end ($V_{SS}$) of the soft-booting voltage generation circuit 10 is greater than the voltage of the threshold voltage source ($V_1$), the control circuit of the switching power supply is in the operational phase.

The error amplification circuit 40 includes an analog multiplex 410 and an error amplifier 420. A first input end of the analog multiplex 410 connects to the output end ($V_{SS}$) of the soft-booting voltage generation circuit 10, a second input end of the analog multiplex 410 connects to the reference voltage source ($V_{ref}$), an output end of the analog multiplex 410 connect to the first input end of the error amplifier 420, a second input end of the error amplifier 420 connects to the output end ($V_{out}$) of the switching power supply, an output end of the error amplifier 420 respectively connects to the negative pole of the first voltage source 320, the negative pole of the second voltage source 330, and the output end ($V_o$) of the switching circuit 50. The analog multiplex 410 compares the voltage of the output end ($V_{SS}$) of the soft-booting voltage generation circuit 10 with the voltage of the reference voltage source ($V_{ref}$), and outputs the smaller one to the error amplifier 420. The error amplifier 420 applies the error amplification toward the voltage of the output end ($V_{out}$) of the switching power supply according to the smaller voltage among the output end ($V_{SS}$) of the soft-booting voltage generation circuit 10 and the reference voltage source ($V_{ref}$). During the soft-booting phase, if the voltage of the output end ($V_{SS}$) of the soft-booting voltage generation circuit 10 is smaller than the voltage of the reference voltage source ($V_{ref}$), the analog multiplex 410 outputs the voltage of the output end ($V_{SS}$) of the soft-booting voltage generation circuit 10 to the error amplifier 420. The error amplifier 420 applies the error amplification toward the voltage of the output end ($V_{out}$) of the switching power supply according to the voltage of the output end ($V_{SS}$) of the soft-booting voltage generation circuit 10. During the operational phase, if the voltage of the output end ($V_{SS}$) of the soft-booting voltage generation circuit 10 is greater than the voltage of the reference voltage source ($V_{ref}$), the analog multiplex 410 outputs the voltage of the reference voltage source ($V_{ref}$) to the error amplifier 420. The error amplifier 420 applies the error amplification toward the voltage of the output end ($V_{out}$) of the switching power supply according to the voltage of the reference voltage source ($V_{ref}$).

The operational principles of the control circuit of the switching power supply will be described in detail hereinafter. During the soft-booting phase, the voltage of the output end ($V_{SS}$) of the soft-booting voltage generation circuit 10 is smaller than the voltage of the threshold voltage source ($V_1$), the output end of the first comparator 20 outputs the second high level signals to the code-dialing switch 310, that is, the selection level signals are the second high level signals. The code-dialing switch 310 connects the first voltage source 320 with the third comparator 510. The voltage of the non-inverting input of the third comparator 510, i.e., the clamping voltage, equals to the voltage of the first voltage source 320 plus the voltage of the output end of the error amplifier 420, i.e., the voltage of the control voltage. When the voltage of the non-inverting input of the third comparator 510 is greater than the voltage of the reference voltage source ($V_2$), the output end of the third comparator 510 outputs third high level signals to the gate of the transistor 520, and the transistor 520 is turned on and the voltage of the non-inverting input of the second comparator 60 equals to the voltage of the auxiliary voltage source ($V_3$). As the voltage of the auxiliary voltage source ($V_3$) is greater than the voltage of the reference voltage source ($V_2$), the second comparator 60 outputs the first high level signals ($V_{sleep}$) to the pulse signal control circuit 70, the clock signal generator 740 is turned off and outputs the first low level signals to the pulse signal generator 80. The pulse signal generator 80 outputs the third low level signals to the switching power supply, and the switching power supply stops supplying the power. As the clock signal generator 740 is turned off, the control circuit of the switching power supply is in the sleep mode. After the switching power supply stops supplying the power, the voltage of the output end ($V_{out}$) of the switching power supply begins to drop, and the voltage of the output end of the error amplifier 420 drops until the voltage of the non-inverting input of the third comparator 510 is smaller than the voltage of the reference voltage source ($V_2$). The control circuit of the switching power supply enters the operation mode, and the above process repeats. In view of the above process, during the soft-booting phase, the voltage of the non-inverting input of the third comparator 510, i.e., the voltage threshold ($V_{c1}$) of the clamping voltage, equals to the voltage of the reference voltage source ($V_2$) minus the voltage of the first voltage source 320. When the voltage of the output end of the error amplifier 420 is smaller than the voltage threshold ($V_{c1}$), the control circuit of the switching power supply is in the operational mode. When the voltage of the output end of the error amplifier 420 is greater than the voltage threshold ($V_{c1}$), the control circuit of the switching power supply is in the sleeping mode.

During the operational phase, the voltage of the output end ($V_{SS}$) of the soft-booting voltage generation circuit 10 is greater than voltage of the threshold voltage source ($V_1$), the output end of the first comparator 20 outputs the second low level signals to the code-dialing switch 310, and the code-dialing switch 310 connects the second voltage source 330 with the third comparator 510. The voltage of the non-inverting input of the third comparator 510 equals to the voltage of the second voltage source 330 plus the voltage of the output end of the error amplifier 420. When the voltage of the non-inverting input of the third comparator 510 is greater than the voltage of the reference voltage source ($V_2$), the output end of the third comparator 510 outputs the third high level signals to the gate of the transistor 520, and the transistor 520 is turned on. The voltage of the non-inverting input of the second comparator 60 equals to the voltage of the auxiliary voltage source ($V_3$). As the voltage of the auxiliary voltage source ($V_3$) is greater than the voltage of the reference voltage source ($V_2$), the second comparator 60 outputs the first high level signals ($V_{sleep}$) to the clock signal generator 740. The clock signal generator 740 is turned off and outputs the first low level signals to the pulse signal generator 80. The pulse signal generator 80 outputs the third low level signals to the switching power supply and the switching power supply stops supplying the power. As the clock signal generator 740 is turned off, the control circuit of the switching power supply is in the sleep mode. After the switching power supply stops supplying the power, the voltage of the output end ($V_{out}$) of the switching power supply begins to drop, and the voltage of the output end of the error amplifier 420 drops until the voltage of the non-inverting input of the third comparator 510 is smaller than the voltage of the reference voltage source ($V_2$). The control circuit of the switching power supply enters the operation mode, and the above process repeats. During the operational phase, the voltage of the non-inverting input of the third comparator 510, i.e., the voltage threshold ($V_{c2}$) of the clamping voltage, equals to the voltage of the reference voltage source ($V_2$) minus the voltage of the first voltage source 330. When the voltage of the output end of the error amplifier 420 is smaller than the voltage threshold ($V_{c2}$), the control circuit of the switching power supply is in the operational mode. When the voltage of the output end of the error amplifier 420 is greater than the voltage threshold ($V_{c2}$), the control circuit of the switching power supply is in the sleeping mode.

In view of the above, during the soft-booting phase, the code-dialing switch 310 connects the first voltage source 320 to the third comparator 510. During the operational phase, the code-dialing switch 310 connects the second voltage source 330 to the third comparator 510. As such, different clamping voltages are configured during the soft-booting phase and the operational phase, which contributes to the system stability. In addition, when the output voltage of the error amplification circuit 40 is greater than the voltage threshold voltage of the clamping voltage, the second comparator 60 outputs the first high level signals ($V_{sleep}$) to the clock signal generator 740. The clock signal generator 740 stops operations, that is, the control circuit of the switching power supply is in the sleep mode, which enhances the efficiency of the power.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A control circuit of switching power supply, comprising:
    a soft-booting voltage generation circuit, a first comparator, a voltage selection circuit, a switching circuit, a second comparator, an error amplification circuit, and a pulse signal control circuit;
    the first comparator compares a voltage of an output end of the soft-booting voltage generation circuit with a threshold voltage, and outputs selection level signals to the voltage selection circuit;
    the error amplification circuit applies an error amplification toward the voltage of an output end of the switching power supply according to the voltage of the output end of the soft-booting voltage generation circuit, and outputs a control voltage to the voltage selection circuit;
    the voltage selection circuit selects a corresponding superposition voltage according to a level of the selection level signals, and the selected superposition voltage is superposed with the control voltage to obtain a clamping voltage for outputting to the switching circuit;
    the switching circuit compares the clamping voltage with a reference voltage, when the clamping voltage is greater than the reference voltage, the switching outputs the clamping voltage via the output end connecting to an auxiliary voltage source and the second comparator, wherein the voltage of the auxiliary voltage source is greater than the voltage of the reference voltage, the output end of the switching power supply respectively connects to the error amplification circuit and the pulse signal control circuit;
    the second comparator compares the voltage of the output end of the switching circuit with the voltage of the reference voltage, and the second comparator outputs first high level signals to the pulse signal control circuit upon determining the voltage of the output end of the switching circuit is greater than the voltage of the reference voltage; and
    the pulse signal control circuit outputs first low level signals to the pulse signal generator of the switching power supply according to the first high level signals.

2. The control circuit of the switching power supply as claimed in claim 1, wherein the voltage selection circuit comprises a code-dialing switch, a first voltage source, and a second voltage source;
    the code-dialing switch respectively connects to the first comparator, the switching circuit, a positive pole of the first voltage source, and a positive pole of the second voltage source; and
    negative poles of the first voltage source and the second voltage source respectively connect to the error amplification circuit and the output end of the switching circuit, and the code-dialing switch selects one of the first voltage source and the second voltage source to be a superposition voltage according to the level of the selection level signals.

3. The control circuit of the switching power supply as claimed in claim 2, wherein the voltage selection circuit further comprises a RC circuit, and the negative poles of the first voltage source and the second voltage are respectively grounded via the RC circuit.

4. The control circuit of the switching power supply as claimed in claim 2, wherein the switching circuit comprises a third comparator and a transistor, an non-inverting input of the third comparator connects to the code-dialing switch, an inverting input of the third comparator receives the reference voltage, an output end of the third comparator connects to a gate of the transistor, a drain of the transistor connects to the auxiliary voltage source, and a source of the transistor operates as the output end of the switching circuit.

5. The control circuit of the switching power supply as claimed in claim 4, wherein the pulse signal control circuit comprises a fourth comparator, an adder, a wave generator, and a clock signal generator, an non-inverting input of the fourth comparator connects to the adder, an inverting input of the fourth comparator connects to the output end of the switching circuit, an output end of the fourth comparator connects to a first input end of the pulse signal generator, the wave generator connects between the adder and the clock signal generator, and the adder further connects to an input end of the switching power supply, and the clock signal generator respectively connects to the second comparator and a second output end of the pulse signal generator.

6. The control circuit of the switching power supply as claimed in claim 5, wherein the soft-booting voltage generation circuit comprises a voltage source, a current generator, and a capacitor, the current generator connects to the voltage source, the current generator is grounded via the capacitor, and the output end of the soft-booting voltage generation circuit connects between the current generator and the capacitor.

7. The control circuit of the switching power supply as claimed in claim 5, wherein an non-inverting input of the first comparator receives the threshold voltage, an inverting input of the first comparator connects to the output end of the soft-booting voltage generation circuit, and the output end of the first comparator connects to the code-dialing switch; and an non-verting input of the second comparator connects to the output end of the switching circuit, an inverting input of the second comparator receives the reference voltage, and an output end of the second comparator connects to the clock signal generator.

8. The control circuit of the switching power supply as claimed in claim 7, wherein the first comparator compares the voltage of the output end of the soft-booting voltage generation circuit with the threshold voltage, and outputs the second high level signals to the code-dialing switch upon determining the voltage of the output end of the soft-booting voltage generation circuit is smaller than the threshold voltage, and the code-dialing switch connects the first voltage source with the non-inverting input of the third comparator upon receiving the second high level signals.

9. The control circuit of the switching power supply as claimed in claim 7, wherein the first comparator compares the voltage of the output end of the soft-booting voltage generation circuit with the threshold voltage, and outputs the second low level signals to the code-dialing switch upon determining the voltage of the output end of the soft-booting voltage generation circuit is greater than the threshold voltage, and the code-dialing switch connects the second voltage source with the non-inverting input of the third comparator upon receiving the second low level signals.

\* \* \* \* \*